(12) United States Patent
Asano et al.

(10) Patent No.: US 8,012,849 B2
(45) Date of Patent: Sep. 6, 2011

(54) SEMICONDUCTOR DEVICE AND MANUFACTURING METHOD THEREOF

(75) Inventors: Masayoshi Asano, Kawasaki (JP); Yoshiyuki Suzuki, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/815,782

(22) Filed: Jun. 15, 2010

(65) Prior Publication Data
US 2010/0255648 A1  Oct. 7, 2010

Related U.S. Application Data

(62) Division of application No. 11/369,845, filed on Mar. 8, 2006, now Pat. No. 7,772,634.

(30) Foreign Application Priority Data

Nov. 25, 2005  (JP) ................................. 2005-340869

(51) Int. Cl.
*H01L 21/76* (2006.01)
(52) U.S. Cl. ....................................... 438/433; 438/424
(58) Field of Classification Search .................. 438/400, 438/424, 433, 420
See application file for complete search history.

(56) References Cited

U.S. PATENT DOCUMENTS

| | | |
|---|---|---|
| 5,306,940 A | 4/1994 | Yamazaki |
| 5,502,320 A | 3/1996 | Yamada |
| 6,294,419 B1 | 9/2001 | Brown et al. |
| 6,326,254 B1 | 12/2001 | Ema et al. |
| 6,437,388 B1 | 8/2002 | Radens et al. |
| 6,444,554 B1 | 9/2002 | Adachi et al. |
| 6,624,525 B2 | 9/2003 | Anezaki et al. |
| 6,785,157 B2 | 8/2004 | Arimoto et al. |
| 7,179,711 B2 * | 2/2007 | Adachi et al. ............ 438/258 |

FOREIGN PATENT DOCUMENTS

JP  2003-092364 A  3/2003

* cited by examiner

*Primary Examiner* — Bradley K Smith
(74) *Attorney, Agent, or Firm* — Westerman, Hattori, Daniels & Adrian, LLP

(57) ABSTRACT

A channel stop region is formed immediately under an STI, and thereafter, an ion implantation is performed with conditions in which an impurity is doped into an upper layer portion of an active region, and at the same time, the impurity is also doped into immediately under another STI, and a channel dose region is formed at the upper layer portion of the active region, and another channel stop region is formed immediately under the STI.

8 Claims, 10 Drawing Sheets

SEMICONDUCTOR DEVICE AND MANUFACTURING METHOD THEREOF

CROSS-REFERENCE TO RELATED APPLICATIONS

This application is a division of U.S. application Ser. No. 11/369,845, filed on Mar. 8, 2006 which is based upon and claims the benefit of priority from the prior Japanese Patent Application No. 2005-340869, filed on Nov. 25, 2005, the entire contents of which are incorporated herein by reference.

BACKGROUND OF THE INVENTION

1. Field of the Invention

The present invention relates to a semiconductor device and a manufacturing method thereof including STI structures, and in particular, it is intended for a semiconductor memory including a transistor structure and a capacitor structure in a memory cell region.

2. Description of the Related Art

In a semiconductor memory device having memory cells taking a constitution storing a data into a capacitor structure, various device configurations are thought out whose objects are to reduce a memory cell area and to improve a degree of integration. In particular, when so-called an STI (Shallow Trench Isolation) structure is used as an element isolation structure, a capacitor structure (isolation/consolidation type capacitor structure) is proposed in which even sidewall portions of isolation trenches are used as component parts of a capacitor, and it is electrically isolated from adjacent memory cells by a buried insulating film at a bottom portion of the isolation trench (refer to Patent Document 1 and so on).

[Patent Document 1] Japanese Patent Application Laid-open No. 2003-92364

Recently, further improvement in a degree of integration is required in a semiconductor memory, and a configuration described in the Patent Document 1 and so on becomes inadequate to comply the request.

A miniaturization of an isolation trench width in the STI structure becomes necessary to realize further improvement in the degree of integration in the semiconductor memory. Meanwhile, a depth of the isolation trench is required to be shallow in reverse from a restriction of a filling property of an insulator into the isolation trench. It is therefore required to enhance a substrate concentration as much as possible by forming so-called a channel stop region by doping an impurity under the insulator filling the isolation trench to secure an enough element isolation ability.

In an isolation/consolidation type capacitor structure, the insulator in the isolation trench corresponding to a formation portion of the corresponding capacitor structure among the isolation trenches is etched to expose an upper portion of a sidewall surface of the isolation trench. It is therefore inevitable that, for example, as shown in FIG. 1, an insulator 112 of an STI structure 102 existing at the formation portion of the corresponding capacitor structure becomes thinner than an insulator 111 of an STI structure 101 existing at a portion other than the formation portion. Consequently, after the insulator 112 is etched to form STI structure 102, the impurity for a channel stop is simultaneously ion implanted into lower portions of the STI structures 101, 102 while the lower portion of the STI structure 101 is used as a reference, and then, a channel stop region 103 which is deeper at a portion under the STI structure 102 than at another portion under the STI structure 101 is formed (shown by inside of a circle in FIG. 1). The channel stop region 103 is too deep under the STI structure 102, and therefore, there is a problem that the substrate concentration immediately under the STI structure 102 becomes thin to cause a deterioration of the element isolation ability.

It can be said that a simultaneous forming of the channel stop region at the lower portions of the STI structures 101, 102 by one time ion implantation is inevitable to avoid an increase of process steps and a complication of a manufacturing process. On the assumption of the above, it is necessary to form the channel stop region at a stage that film thicknesses of the insulating films 111, 112 are the same (before a surface layer of the insulating film 112 is etched), to form the channel stop region under the STI structures 101, 102 at equivalent positions.

In detail, at first, the impurity for the channel stop is simultaneously ion implanted into the lower portions of the STI structures 101, 102 before the surface layer of the insulating film 112 is etched, as shown in FIG. 2A. At this time, the channel stop region 103 is formed in an equivalent depth at the lower portions of the STI structures 101, 102.

Subsequently, a resist mask 113 opening the STI structure 102 is formed as shown in FIG. 2B, and a part of the insulator 112 inside of the STI structure 102 is etch removed by using this resist mask 113. Here, it is required to surely take an alignment margin when the resist mask 113 is formed, and therefore, an opening 113a of the resist mask 113 is formed larger than a width size of the isolation trench of the STI structure 102 by a lithography. A dry etching is performed in a state the resist mask 113 is formed as stated above, and therefore, a part of a substrate surface 114 exposing from the opening 113a of the resist mask 113 is also subjected to the etching when the insulator 112 is etched, and receives an etching damage. Namely, various molecules included in an etching gas go inside of the substrate from the part of the substrate surface 114, and the molecules become enhanced oxidation factors in a subsequent forming process of an oxide film (or an oxynitride film) (forming process of a capacitor insulating film). A substantial film thickness of the capacitor insulating film increases by an enhanced oxidation originated in the above, then a desired and designed value of capacity cannot be obtained because a capacity value becomes a small value, and a problem occurs in which a dispersion of the capacity becomes large.

SUMMARY OF THE INVENTION

The present invention is made in consideration of the above-stated problems, and an object thereof is to provide a semiconductor device and a manufacturing method thereof enabling to form a channel stop region at a desired portion under respective STI structures having different insulator thicknesses, and to easily and certainly realize a further improvement in a degree of integration in a semiconductor memory, without incurring an increase of process steps and a complication of a manufacturing process.

A semiconductor device according to the present invention, which includes a semiconductor substrate, and plural element isolation structures defining active regions on the semiconductor substrate and constituted by trenches respectively formed at plural element isolation regions of the semiconductor substrate, and inside of the respective trenches are filled with insulators, wherein the plural element isolation structures are composed of a first element isolation structure in which the insulator inside of the trench is thick and a second element isolation structure in which the insulator is thinner than the first element isolation structure, the semiconductor device including: a first impurity region at least formed at a lower portion of the first element isolation structure in the semiconductor substrate; a second impurity region formed at a matched portion under the second element isolation structure in the semiconductor substrate, and deeper than the first impurity region; a third impurity region formed at a surface layer portion of the active region; and a fourth impurity region formed at a matched portion under the second element isolation structure in the semiconductor substrate, and between the second element isolation structure and the second impurity region.

A manufacturing method of a semiconductor device, including the steps of: forming trenches at plural element isolation regions of a semiconductor substrate respectively, and filling inside of the respective trenches with insulators; defining active regions on the semiconductor substrate by forming a first element isolation structure in a first trench and a second element isolation structure in a second trench respectively by removing a part of the insulator only from inside of the second trench, in which the formed respective trenches are the first trench or the second trench; simultaneously forming a first impurity region at least at a lower portion of the first element isolation structure and a second impurity region at a matched portion under the second element isolation structure and deeper than the first impurity region by doping a first impurity into a portion including the first element isolation structure and the second element isolation structure of the semiconductor substrate; and simultaneously forming a third impurity region at a surface layer portion of the active region and a fourth impurity region at a matched portion under the second element isolation structure and between the second element isolation structure and the second impurity region by doping a second impurity into a portion including the first element isolation structure and the second element isolation structure of the semiconductor substrate.

DETAILED DESCRIPTION OF THE PREFERRED EMBODIMENTS

Basic Gist of Present Invention

The present inventor studied hard to solve the above-stated problems, and as a result, the inventor comes up with a technical idea to form a channel stop region efficiently without incurring an increase of process steps and a complication of a manufacturing process, by positively applying an impurity doping for a threshold voltage adjustment of a transistor structure.

A method to be a preliminary step of the idea is explained for describing the present invention in detail.

The present inventor firstly examined a forming method of an isolation/consolidation type capacitor structure as described under.

Figure 1:
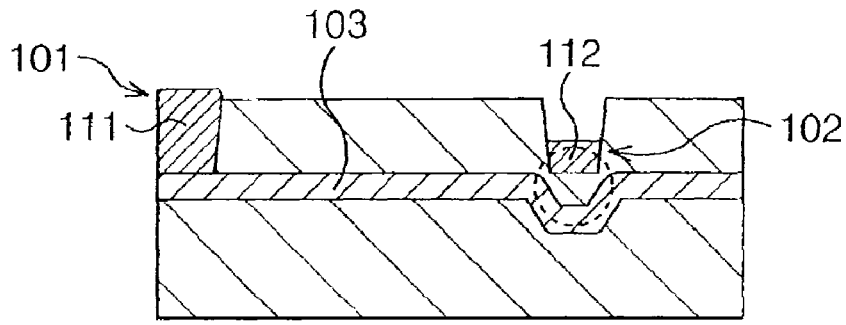
FIG. 1 is a schematic sectional view for explaining problems when an isolation/consolidation type capacitor structure is formed in a conventional art.
Figure 2A:
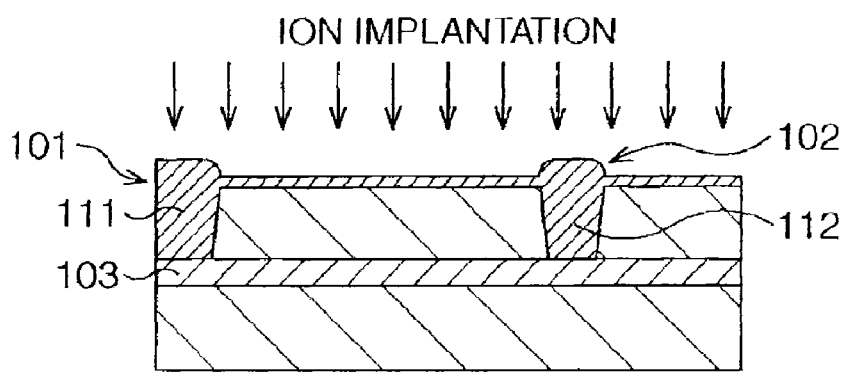
FIG. 2A and FIG. 2B are schematic sectional views showing a process flow forming the isolation/consolidation type capacitor structure in the conventional art.
Figure 2B:
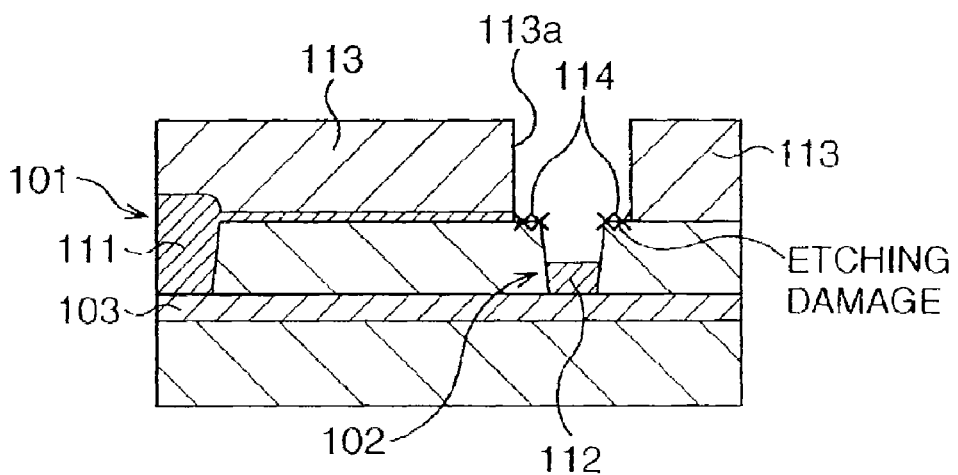
Figure 3A:
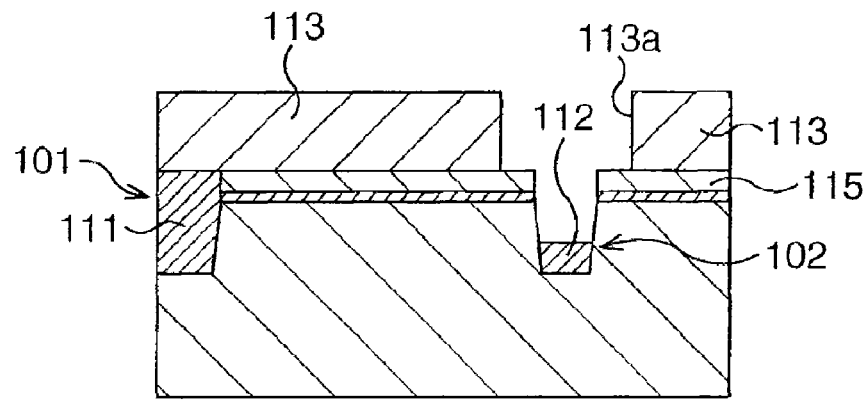
FIG. 3A, FIG. 3B, and FIG. 3C are schematic sectional views showing a method to be a preliminary step toward a conception of the present invention.

At first, a surface layer of an insulating film 112 is etched by using a resist mask 113 under a state of forming a protective film 115 such as a silicon nitride film so as not to give an etching damage to a semiconductor substrate, as shown in FIG. 3A.

Figure 3B:
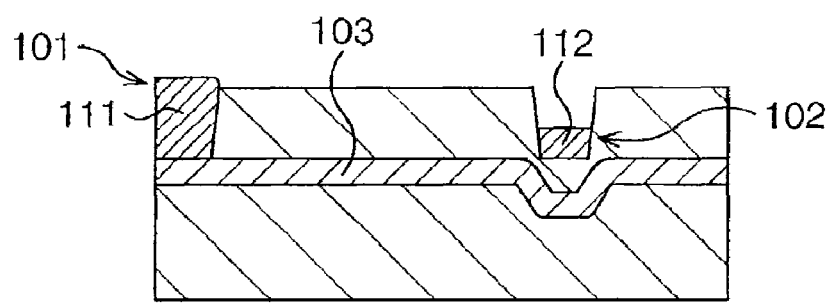

Subsequently, the resist mask 113 and the protective film 115 are removed, and an impurity for a channel stop is simultaneously ion implanted into lower portions of STI structures 101, 102, as shown in FIG. 3B. At this time, a channel stop region 103 is formed so that the lower portion of the STI structure 102 becomes deeper than the lower portion of the STI structure 101.

Figure 3C:
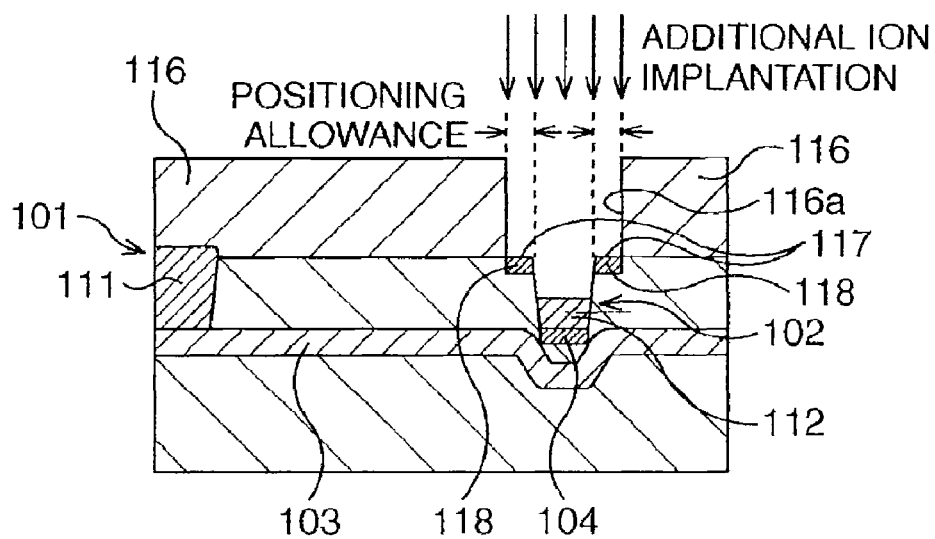

Subsequently, as shown in FIG. 3C, a resist mask 116 opening the STI structure 102 is formed, and the impurity for the channel stop is ion implanted again into the lower portion of the STI structure 102, here, at a position between a bottom surface of the STI structure 102 and the channel stop region 103 using the resist mask 116. Herewith, a channel stop region 104 is locally formed at the above-stated position. An impurity concentration of the channel stop of the STI structure 102 is interpolated by the channel stop region 104, and an element isolation ability improves.

However, in this case, there is a problem as shown in the following.

It is necessarily required to take an alignment margin when the resist mask 116 is formed as same as the above-stated resist mask 113, and therefore, an opening 116a of the resist mask 116 is formed larger than a width size of an isolation trench of the STI structure 102 by a lithography. The ion implantation is performed in a state the resist mask 116 is formed as stated above, and therefore, a part of a substrate surface 117 exposing from the opening 116a of the resist mask 116 is also subjected to the ion implantation. Consequently, the ion implantation is performed to the part of the substrate surface 117 concurrently with the channel stop region 104 to form an impurity region 118.

When a semiconductor memory is formed, a transistor structure writing/reading information to/from the capacitor structure is formed at an active region so as to be adjacent to the capacitor structure. It is required to perform an ion implantation into an upper layer portion of the active region to form a channel dose region, so as to control a threshold voltage in this transistor structure to improve transistor characteristics. This is the same as in the isolation/consolidation type capacitor structure, and the ion implantation for the channel dose is fundamental for the improvement of the characteristics of the transistor structure.

In the present method, the ion implantation for the channel dose becomes a problem. Namely, in this case, the ion implantation is performed also into the part of the substrate surface 117, and the impurity is doped so as to superimpose with the impurity region 118 at the part of the substrate surface 117. The impurities having the same conductivity type are doped into the channel stop and the channel dose, and therefore, the impurity concentration becomes high only at the part of the substrate surface 117. Consequently, a negative effect is exerted on capacity characteristics of the capacitor structure.

The present inventor examined a structure to complete the ion implantation for the channel stop by one time without performing plural times as in the method described above, and to perform the ion implantation for the channel dose without exerting the negative effect on the capacity characteristics of the capacitor structure by referring to the above-stated method as a steppingstone. As a result, the inventor comes up with an idea to have a structure in which another ion implantation for the channel stop in the above-stated method is performed concurrently with the ion implantation for the channel dose, by using that the same conductivity type impurities are doped for both ion implantations.

Figure 4A:
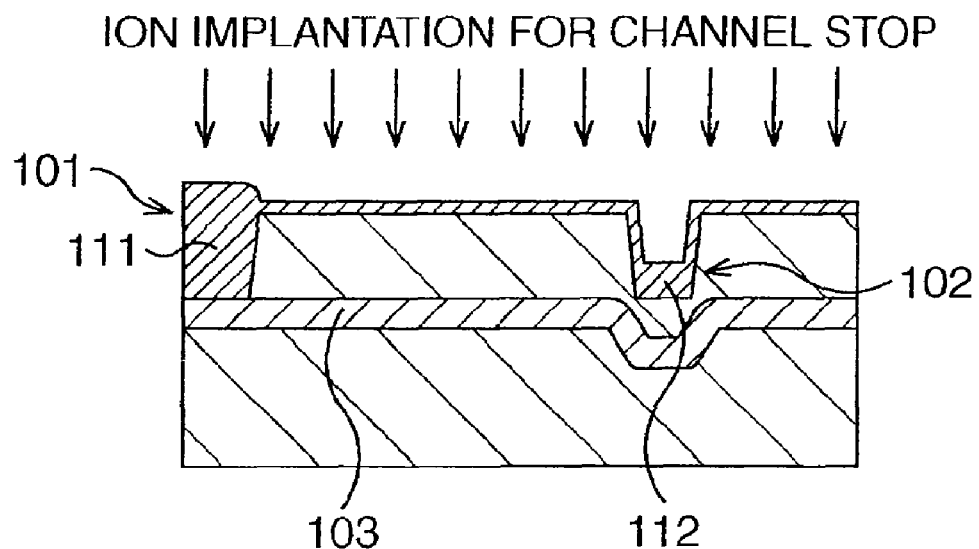
FIG. 4A and FIG. 4B are schematic sectional views for explaining a basic gist of the present invention.

Namely, at first, the ion implantation for the channel stop is performed into immediately under the STI structure 101, as shown in FIG. 4A as same as in FIG. 3B. Herewith, the channel stop region 103 is formed at the lower portion of the STI structure 101. This channel stop region 103 is formed deeper at a portion under the STI structure 102 than the lower portion of the STI structure 101.

Figure 4B:
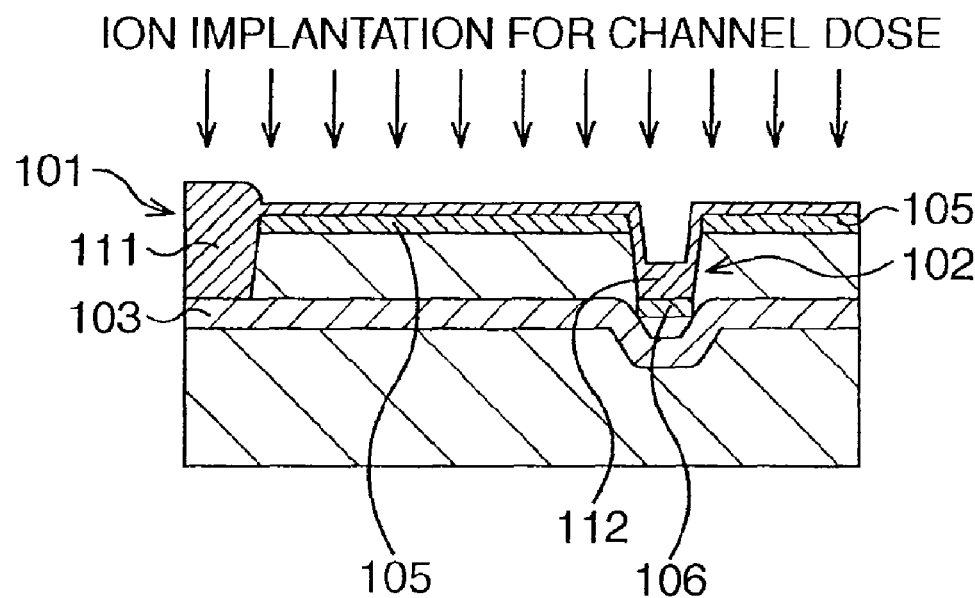

Subsequently, as shown in FIG. 4B, the ion implantation for the channel dose and the channel stop is performed with conditions in which the impurity is simultaneously doped into immediately under the STI structure 102 when the impurity is doped into the upper layer portion of the active region (a desired shallow portion so as to obtain an enough threshold voltage controlling effect). At this time, a channel dose region 105 is formed at the upper layer portion of the active region, and a channel stop region 106 is locally formed immediately under the STI structure 102. The channel dose region 105 contributes to a threshold voltage control of the transistor structure, and the channel stop region 106 contributes to secure the enough element isolation ability of the STI structure 102.

Here, it is necessary to satisfy the following requirements for forming the STI structures 101, 102, the channel stop regions 103, 106, and the channel dose region 105 in the desired states as stated above without incurring the increase of the process steps.

(1) Securing the enough element isolation ability of the STI structure 101.

(2) Securing the enough element isolation ability of the STI structure 102.

(3) Improving the transistor characteristics by controlling the threshold voltage in the transistor structure (4) Simultaneously forming the channel dose region 105 and the channel stop region 106 by the one time ion implantation.

Figure 5:
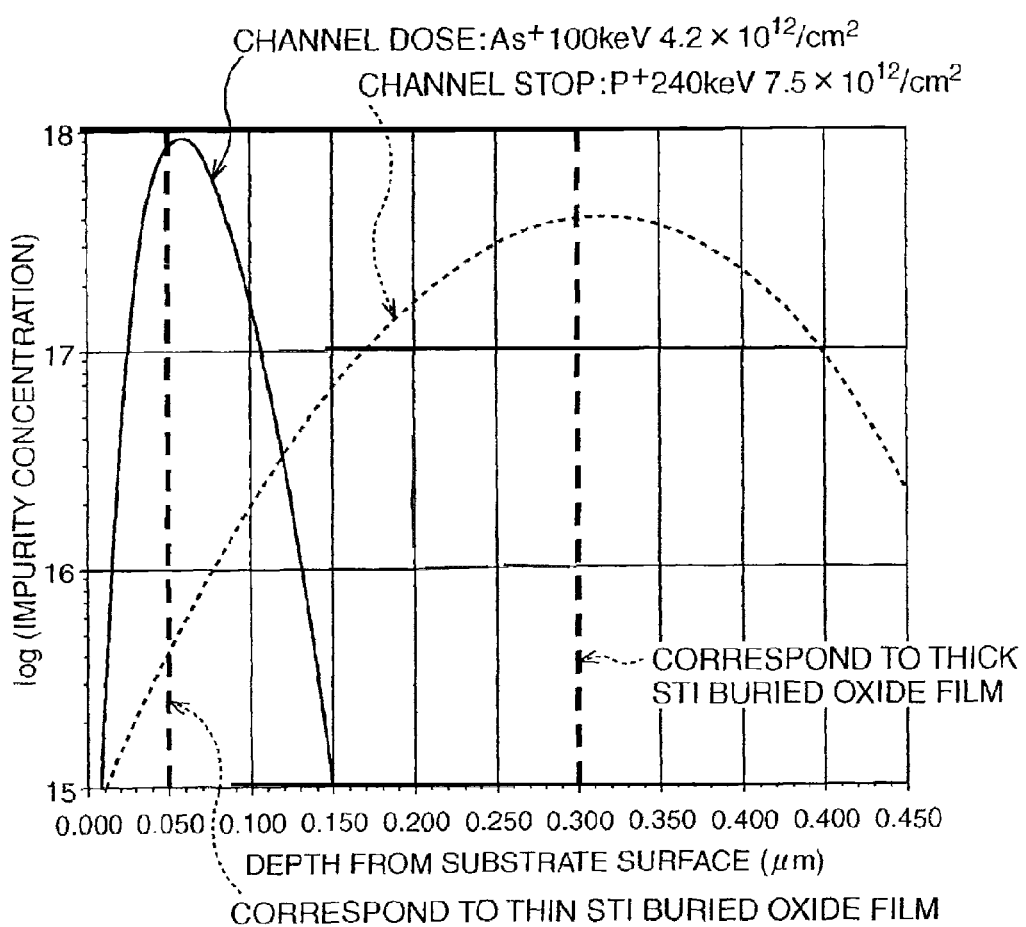
FIG. 5 is a characteristic chart showing a result in which an impurity concentration profile of just after an ion implantation is calculated by a predetermined semiconductor simulator.
Figure 6A:
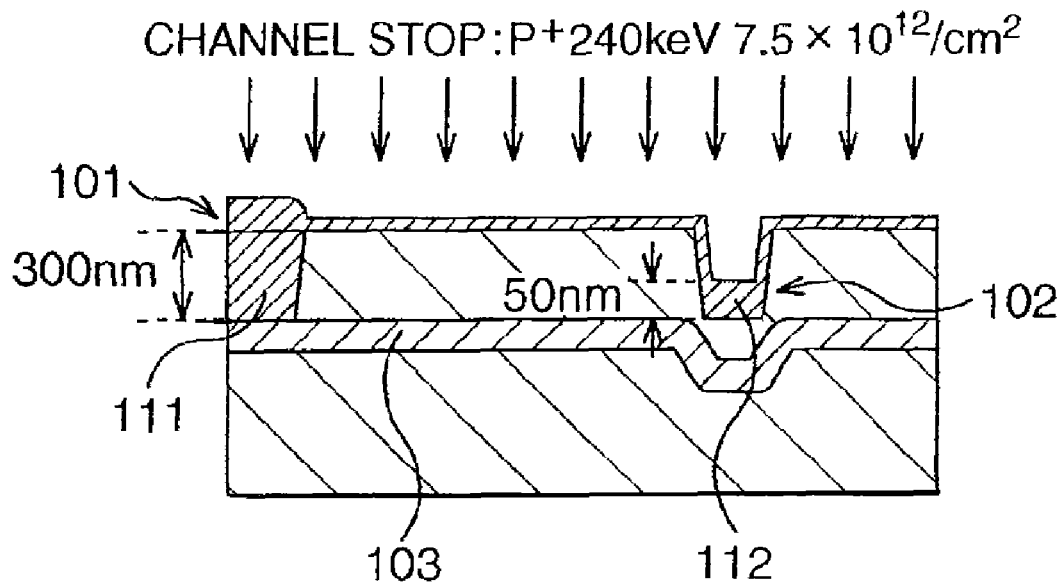
FIG. 6A and FIG. 6B are schematic sectional views for explaining FIG. 5.
Figure 6B:
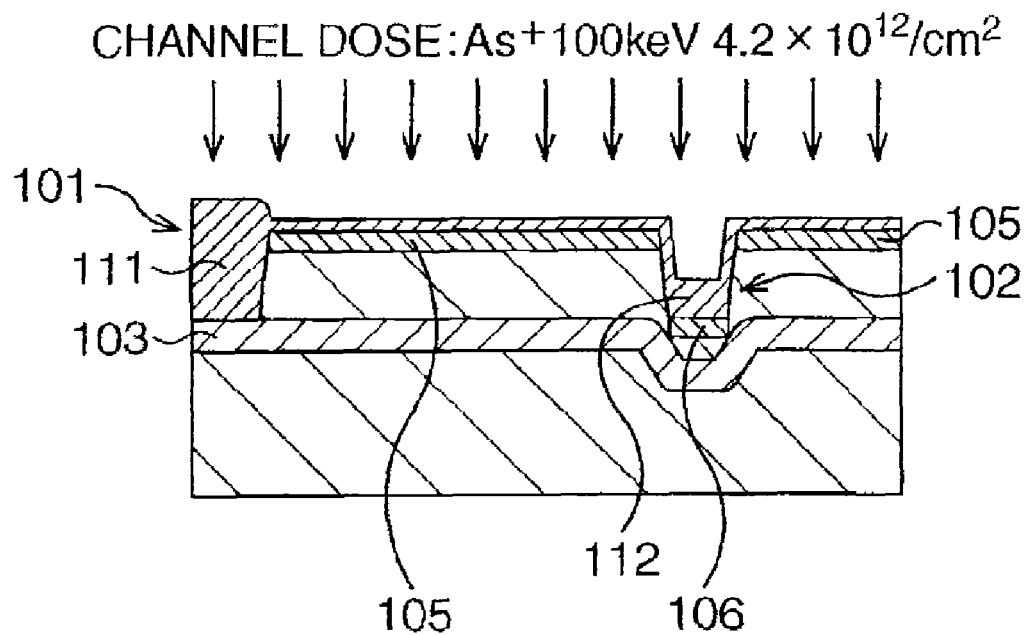

Impurity concentration profiles just after the implantations are calculated by a predetermined semiconductor simulator as for the ion implantation for the channel stop of the STI structure 101 and the ion implantation for the channel stop and the channel dose of the STI structure 102, so as to satisfy the requirements from (1) to (4), and the results are shown in FIG. 5. Here, a case in which film thicknesses of the insulators 111, 112 of the STI structures 101, 102 are respectively set to be 300 nm, 50 nm is exemplified as shown in FIG. 6A and FIG. 6B. FIG. 6A is corresponding to FIG. 4A, and FIG. 6B is corresponding to FIG. 4B respectively.

The film thickness of the insulator 111 of the STI structure 101 and a forming condition of the channel stop region 103 are to be optimized to satisfy the requirement (1). An ion implantation condition when the channel stop region 103 is formed is optimized in accordance with the film thickness of the insulator 111 so that the impurity penetrates into the insulator 111 and an impurity concentration peak at a desired value is to be positioned at the lower portion of the insulator 111. For example, the requirement (1) is satisfied when the film thickness of the insulator 111 is approximately 300 nm, phosphorus ($P^+$) is used as the impurity, an acceleration energy is approximately 240 keV, and a dose amount is approximately $7.5 \times 10^{12}/cm^2$.

The requirements (2) and (3) are necessary to be satisfied simultaneously from a relation with the requirement (4). In this case, the film thickness of the insulator 112 of the STI structure 102 and the forming conditions of the channel dose region 105 and the channel stop region 106 are to be optimized. The ion implantation conditions when the channel dose region 105 and the channel stop region 106 are formed are optimized in accordance with the film thickness of the insulator 112 so that the impurity penetrates into the insulator 112 and the impurity concentration peak at a desired value is to be positioned at the lower portion of the insulator 112, and the impurity concentration peak at the desired value is to be positioned at the upper layer portion of the active region. For example, the requirements from (2) to (4) are satisfied when the film thickness of the insulator 112 is approximately 50 nm, arsenic ($As^+$) is used as the impurity, the acceleration energy is approximately 100 keV, and the dose amount is approximately $4.2 \times 10^{12}/cm^2$.

When the film thickness of the insulator 111 of the STI element isolation structure 101 is approximately 300 nm, and the film thickness of the insulator 112 of the STI structure 102 is approximately 50 nm, it is possible to improve the capacity of the isolation/consolidation type capacitor structure because an enough area of exposing sidewall surfaces of the STI structure 102 is secured while it is corresponding to a miniaturization and a high integration density of the semiconductor memory in recent years. As stated above, it becomes obvious that the ion implantation condition satisfying every requirement from (1) to (4) exists when the STI structures are formed so as to have the insulators with the preferable film thicknesses.

Incidentally, when the respective film thicknesses of the insulators 111, 112 of the STI structures 101, 102 are changed, the respective ion implantation conditions are to be optimized in accordance to the respective film thicknesses following to the method described above.

—Concrete Embodiments Applying Present Invention—

Hereinafter, concrete embodiments are described in detail with reference to the drawings reflecting the above-described basic gist of the present invention. In the present embodiment, a semiconductor memory including an isolation/consolidation type capacitor structure is exemplified.

FIG. 7A to FIG. 10B are schematic sectional views showing a manufacturing method of the semiconductor memory according to the present embodiment in a process step sequence. FIG. 11 is a schematic plan view corresponding to FIG. 10B, and FIG. 7A to FIG. 10B are corresponding to a cross section of a position taken along the I-I' line in FIG. 11. In FIG. 7A to FIG. 10B, only a transistor region Tr and a capacitor region Cp of the semiconductor memory (both are collectively referred to as a memory cell MC) are shown.

Figure 7A:
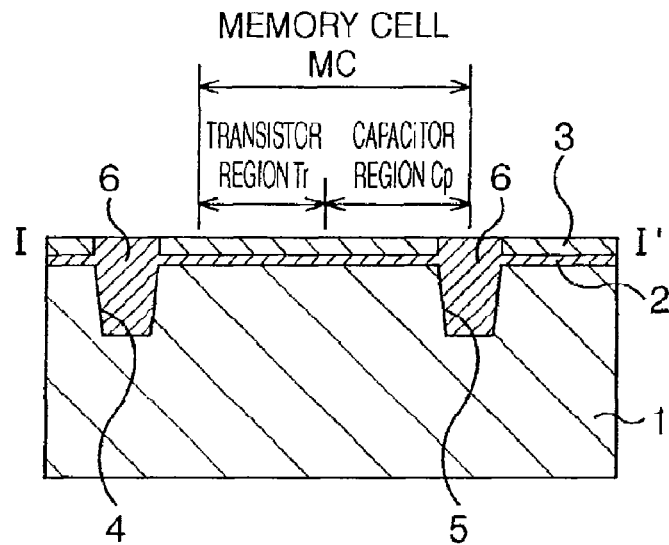
FIG. 7A, FIG. 7B, and FIG. 7C are schematic sectional views showing a manufacturing method of a semiconductor memory according to the present embodiment in a process flow sequence.

At first, inside of respective isolation trenches 4, 5 formed by an STI method are filled with an insulator 6 as shown in FIG. 7A.

In detail, at first, for example, a P-type silicon semiconductor substrate 1 is prepared, an initial oxide film 2 is formed by thermal oxidizing a surface of the silicon semiconductor substrate 1, and thereafter, an $Si_3N_4$ film 3 is deposition formed on the initial oxide film 2.

Next, the $Si_3N_4$ film 3, the initial oxide film 2, and the silicon semiconductor substrate 1 are processed by a lithography and a dry etching, and then, the isolation trenches 4, 5 with depths of, for example, approximately 300 nm are formed at element isolation regions of the silicon semiconductor substrate 1. Here, the depths of the isolation trenches 4, 5 contribute to a capacitor capacitance, and they can be changed accordingly.

Next, a resist (not shown) used as a mask of the dry etching is removed by an asking treatment and so on, and then, an insulator 10, for example, a silicon oxide is deposited on the $Si_3N_4$ film 3 so as to fill the isolation trenches 4, 5 by a CVD method and so on. A chemical mechanical polishing (CMP) is performed to planarize the insulator 10, by using the $Si_3N_4$ film 3 as a polishing stopper.

Figure 7B:
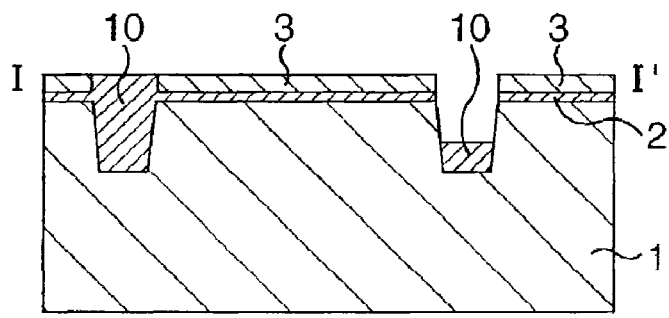

Subsequently, a part of the insulator 10 inside of the isolation trench 5 is removed, as shown in FIG. 7B.

In detail, a resist mask (not shown) opening only for the isolation trench 5 (and the circumference thereof) is formed, and an upper layer portion of the insulator 10 inside of the isolation trench 5 is dry etched to be removed by using this resist mask. Here, the insulator 10 inside of the isolation trench 5 is etched, for example, approximately 250 nm. Herewith, the insulator 10 with approximately 50 nm in thickness is remained inside of the isolation trench 5.

Figure 7C:
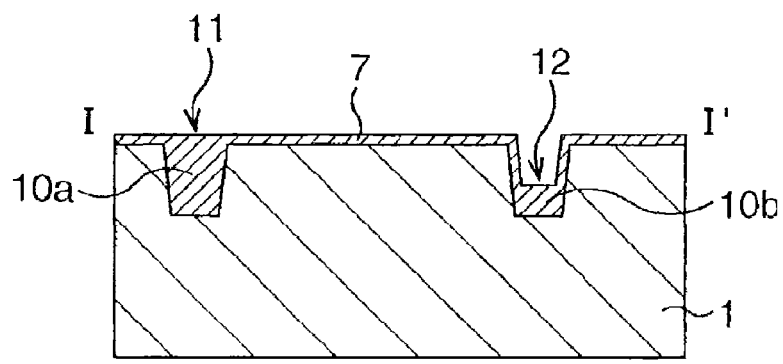

Subsequently, a first element isolation structure 11 and a second element isolation structure 12 are formed as shown in FIG. 7C.

In detail, the $Si_3N_4$ film 3 and the initial oxide film 2 are dissolved and removed by a wet etching. Phosphoric acid solution, hydrofluoric acid solution, and so on, are used as an etching solution. At this time, the first element isolation structure 11 constituted by filling inside of the isolation trench 4 with the insulator 10, and the second element isolation structure 12 constituted by remaining the insulator 10 at the lower portion inside of the isolation trench 5 are formed, and active regions 20 (shown in FIG. 11) is defined on the silicon semiconductor substrate 1. Hereinafter, the insulator 10 inside of the isolation trench 4 is referred to as an insulator 10a, and the insulator 10 inside of the isolation trench 5 is referred to as an insulator 10b for convenience of description.

After that, a surface of the active region is thermal oxidized, to form a thermal oxide film 7 functioning as a protective film for later-described various ion implantations with, for example, the film thickness of approximately 10 nm.

Figure 8A:
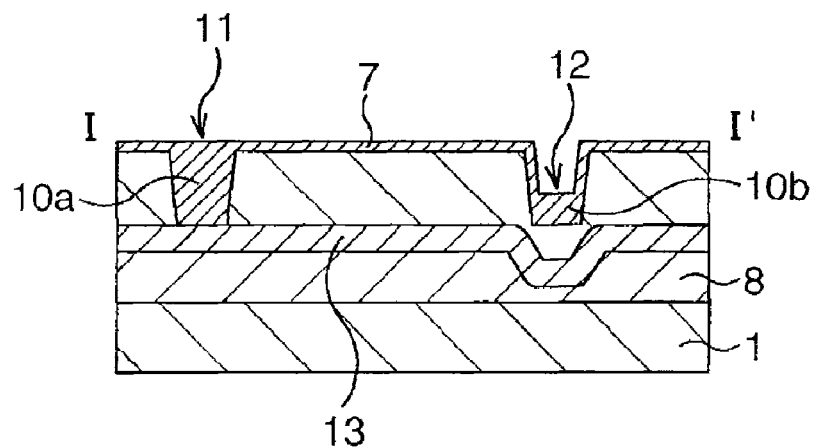
FIG. 8A, FIG. 8B, and FIG. 8C are schematic sectional views showing the manufacturing method of the semiconductor memory according to the present embodiment in the process flow sequence following to FIG. 7C.

Subsequently, after an N-type well 8 is formed, a channel stop region 13 is formed as shown in FIG. 8A.

In detail, at first, a resist mask (not shown) opening the transistor region Tr and the capacitor region Cp is formed on the silicon semiconductor substrate 1, and the ion implantation is performed into the transistor region Tr and the capacitor region Cp by using this resist mask. As a condition for the ion implantation, an N-type impurity, for example, phosphorus (P) is used, an acceleration energy is 600 keV, a dose amount is $3.0 \times 10^{13}/cm^2$. The N-type well 8 is formed by this ion implantation.

Next, the ion implantation is performed into the transistor region Tr and the capacitor region Cp so that an impurity concentration peak is positioned at the lower portion, preferably, immediately under the insulator 10a of the first element isolation structure 11, by continuously using the above-stated resist mask. The condition of the ion implantation affects an element isolation ability of peripheral circuit region in the corresponding semiconductor memory, and it is possible to be changed appropriately according to the depth of the isolation trench 4 of the first element isolation structure 11. In the present embodiment, as the condition of the ion implantation, the N-type impurity, for example, phosphorus (P) is used, the acceleration energy is 240 keV, the dose amount is $7.5 \times 10^{12}/cm^2$. The channel stop region 13 is formed by this ion implantation. The channel stop region 13 is formed so as to extend from the transistor region Tr to the capacitor region Cp inside of the silicon semiconductor substrate 1, and it is formed at a deeper position at the lower portion of the insulator 10b of the second element isolation structure 12 than at the lower portion of the insulator 10a by an extent that the insulator 10b is thinner than the insulator 10a.

Figure 8B:
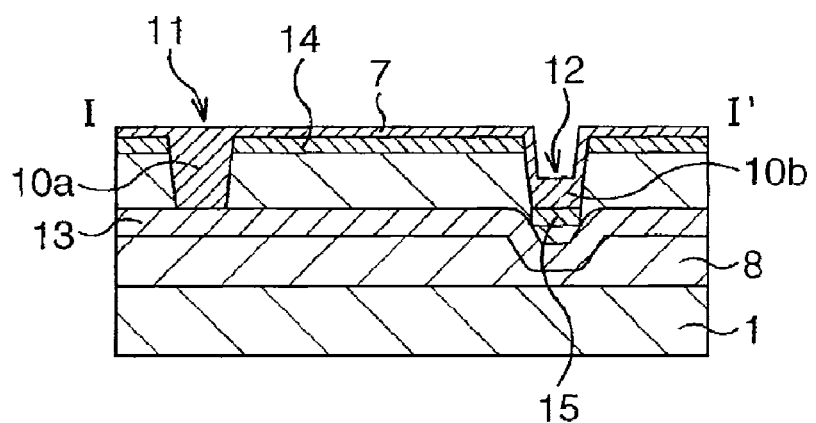

Subsequently, a channel dose region 14 is formed at an upper layer portion of the active region, and a channel stop region 15 is formed at the lower portion of the insulator 10b of the second element isolation structure 12 simultaneously, as shown in FIG. 8B.

In detail, the N-type impurity is ion implanted with the condition in which the impurity concentration peak is positioned at the upper layer portion of the active region, and the impurity concentration peak is positioned at the lower portion of the insulator 10b of the second element isolation structure 12 (between the insulator 10b and the channel stop region 13), preferably, immediately under the insulator 10b. After that, the resist mask is removed by the asking treatment and so on. The condition of the ion implantation is determined by the thickness of the insulator 10b, the impurity concentration at the lower portion of the insulator 10b, and characteristics of peripheral transistors at the peripheral circuit region in the corresponding semiconductor memory. The impurity concentration is possible to be changed appropriately so that the impurity concentration at the lower portion of the insulator 10b is equivalent or more compared to the impurity concentration at the lower portion of the insulator 10a. It is preferable that the impurity concentration of the channel stop region 15 is set to be $1 \times 10^{17}/cm^3$ or more. In the present embodiment, as the condition of the ion implantation, the N-type impurity, for example, arsenic (As) is used, the acceleration energy is 100 keV, the dose amount is $4.3 \times 10^{12}/cm^2$. The channel dose region 14 is formed at the upper layer portion of the active region, and the channel stop region 15 is formed immediately under the insulator 10b of the second element isolation structure 12 simultaneously.

Figure 8C:
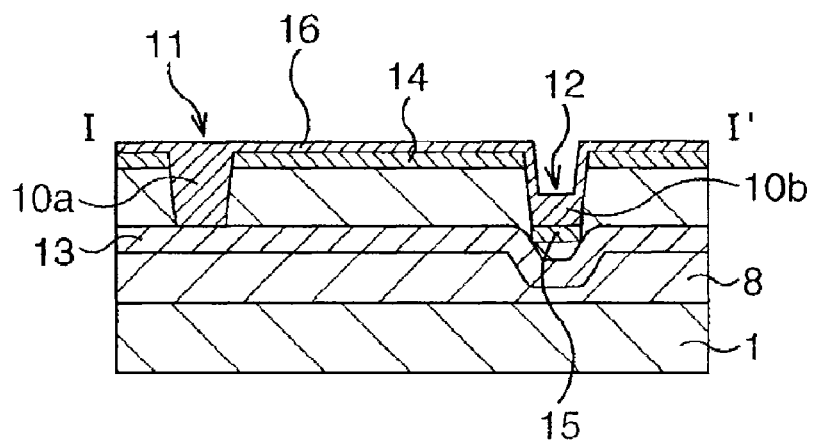

Subsequently, a silicon oxide film 16 functioning as a gate insulating film and a capacitor insulating film (dielectric film) is formed as shown in FIG. 8C.

In detail, at first, the thermal oxide film 7 is dissolved and removed by the wet etching. Hydrofluoric acid solution is used as the etching solution.

Next, the surface of the active region is thermal oxidized, and an insulating film functioning as the gate insulating film and the capacitor insulating film, here, the silicon oxide film 16 is formed, for example, to be the film thickness of approximately 2.3 nm. Incidentally, the insulating films such as the silicon oxide films having different film thicknesses between the transistor region Tr and the capacitor region Cp may be respectively formed by so-called a dual gate insulating film process, instead of forming the silicon oxide film 16.

Figure 9A:
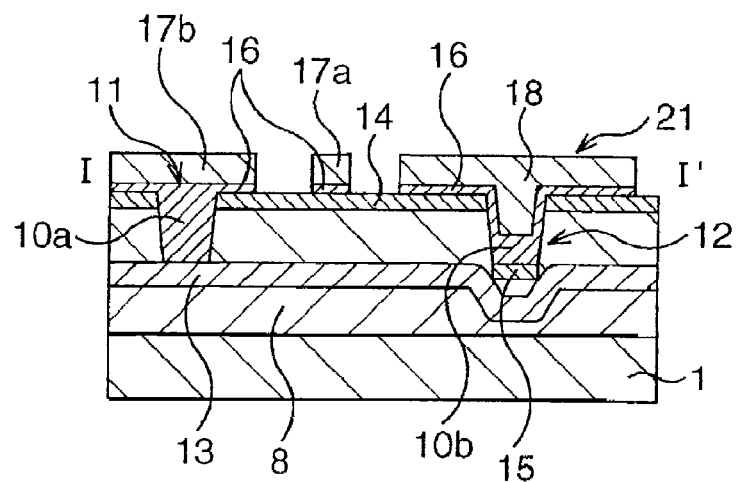
FIG. 9A, FIG. 9B, and FIG. 9C are schematic sectional views showing the manufacturing method of the semiconductor memory according to the present embodiment in the process flow sequence following to FIG. 8C.

Subsequently, gate electrodes 17a, 17b, and a cell plate electrode 18 are simultaneously pattern formed, as shown in FIG. 9A.

In detail, a polycrystalline silicon film (not shown) is deposited on the silicon oxide film 16 to be, for example, the film thickness of approximately 180 nm by, for example, the CVD method.

Next, this polycrystalline silicon film and the silicon oxide film 16 are processed by the lithography and the dry etching, and the gate electrode 17a is pattern formed at the transistor region Tr, and the cell plate electrode 18 is pattern formed at the capacitor region Cp simultaneously. Here, the silicon oxide film 16 existing between the gate electrode 17a and the silicon semiconductor substrate 1 functions as the gate insulating film, and the silicon oxide film 16 existing between the cell plate electrode 18 and the silicon semiconductor substrate 1 functions as the capacitor insulating film, respectively.

The cell plate electrode 18 functioning as an upper electrode makes capacitive coupling with the silicon semiconductor substrate 1 functioning as a lower electrode. Here, a pair of isolation/consolidation type capacitor structures 21a, 21b constituted by being electrically isolated by the insulator 10b are completed.

The isolation/consolidation type capacitor structure 21a is a left side portion of the insulator 10b in FIG. 9A, and a left side portion of the cell plate electrode 18 and the silicon semiconductor substrate 1 make capacitive coupling via the silicon oxide film 16 existing from the active region to a sidewall upper portion at the left side of the isolation trench 5. Meanwhile, the isolation/consolidation type capacitor structure 21b is a right side portion of the insulator 10b in FIG. 9A, and a right side portion of the cell plate electrode 18 and the silicon semiconductor substrate 1 make capacitive coupling via the silicon oxide film 16 existing from the active region to a sidewall upper portion of the right side of the isolation trench 5.

Figure 9B:
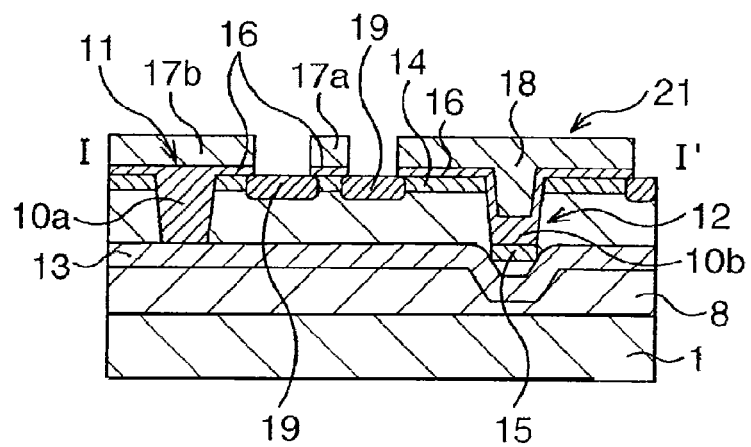

Subsequently, an LDD region 19 and so on are formed as shown in FIG. 9B.

In detail, a resist mask (not shown) opening the transistor region Tr and the capacitor region Cp is formed on the silicon semiconductor substrate 1, and the ion implantation is performed into the transistor region Tr and the capacitor region Cp by using this resist mask. As the condition of the ion implantation, the P-type impurity, for example, boron (B) is used, the acceleration energy is 0.5 keV, the dose amount is $3.6 \times 10^{14}/cm^2$. This ion implantation is performed by using the above-stated resist mask, the gate electrodes 17a, 17b, and the cell plate electrode 18 as the masks. The LDD (Light Doped Drain) regions 19 are formed at a surface layer of the active regions at both sides of the gate electrode 17a by the corresponding ion implantation.

Here, so-called a HALO implantation may be performed subsequently as an action for a punch-through particularly in the peripheral transistors at the peripheral circuit region. As the condition of the ion implantation, the N-type impurity, for example, arsenic (As) is used, the acceleration energy is 80 keV, the dose amount is $2.6 \times 10^{13}/cm^2$.

The ion implantations for the LDD region 19 and HALO may affect on the transistor characteristics, and therefore, these ion implantations may not be performed according to a requirement.

Figure 9C:
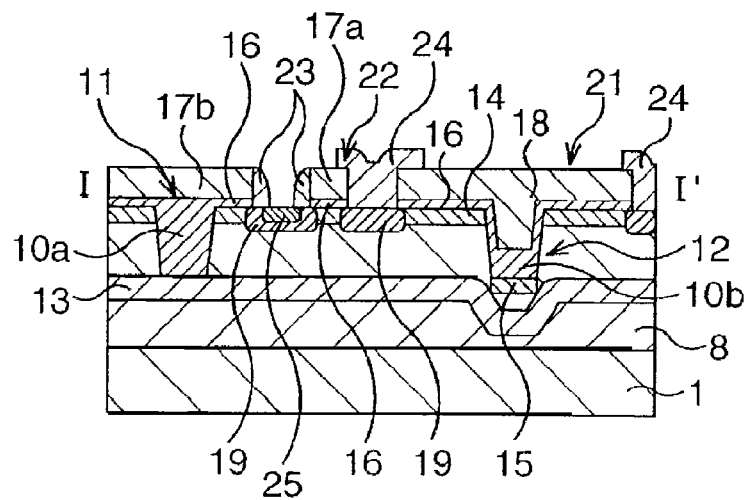

Subsequently, sidewall insulating films 23, 24, a drain region 25, and so on are formed, as shown in FIG. 9C.

In detail, an insulating film, here, a silicon oxide film (not shown) is deposited on a whole surface by the CVD method and so on. A resist mask (not shown) opening a portion corresponding to a required portion, here, a drain region of the transistor structure, is formed, and thereafter, an anisotropic etching (etch back) is performed for the silicon oxide film. Herewith, the silicon oxide film remains at the facing respective sidewall portions of the gate electrodes 17a, 17b, to form the sidewall insulating films 23, and the silicon oxide films remain between the gate electrode 17a and the cell plate electrode 18 which are not subjected to the anisotropic etching, to form the sidewall insulating film 24.

The resist mask is thereafter removed by the asking treatment and so on.

Here, the sidewall insulating films 24 are remained, because an increase of a junction leakage current by the subsequent implantation of a high-concentration impurity into the LDD region 19 between the gate electrode 17a and the cell plate electrode 18, is worried. However, the sidewall insulating films 23 may be formed such as the region where the gate electrodes 17a, 17b are facing.

Next, the ion implantation is performed into a region sandwiched by the sidewall insulating films 23, namely a portion corresponding to the drain region of the transistor structure. As the condition of the ion implantation, the P-type impurity, for example, boron (B) is used, the acceleration energy is 5 keV, the dose amount is $4.0 \times 10^{15}/cm^2$. Boron is doped into inside of the gate electrodes 17a, 17b, and inside of the cell plate electrode 18, together with the region corresponding to the drain region of the transistor structure. A drain region 25 with higher impurity concentration than the LDD region 19 is formed at the drain region of the transistor structure so as to superimpose with the LDD region 19. At this time, a transistor structure 22 including the gate electrodes 17a, 17b interposing the silicon oxide film 16 with the silicon semiconductor substrate 1, the drain region 25 (and the LDD region 19 superimposed with this), and the LDD region 19 functioning as a source region, is completed.

Figure 10A:
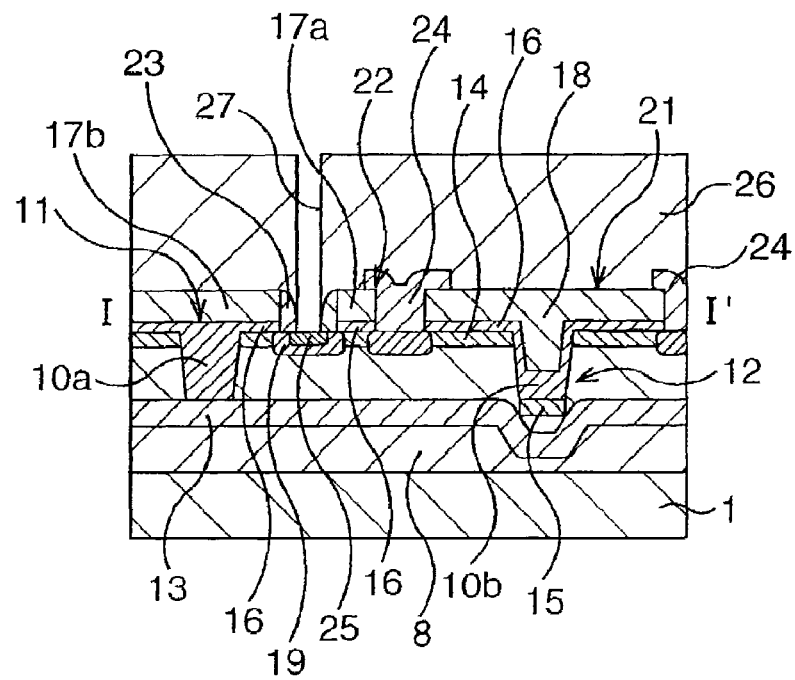
FIG. 10A and FIG. 10B are schematic sectional views showing the manufacturing method of the semiconductor memory according to the present embodiment in the process flow sequence following to FIG. 9C.
Figure 11:
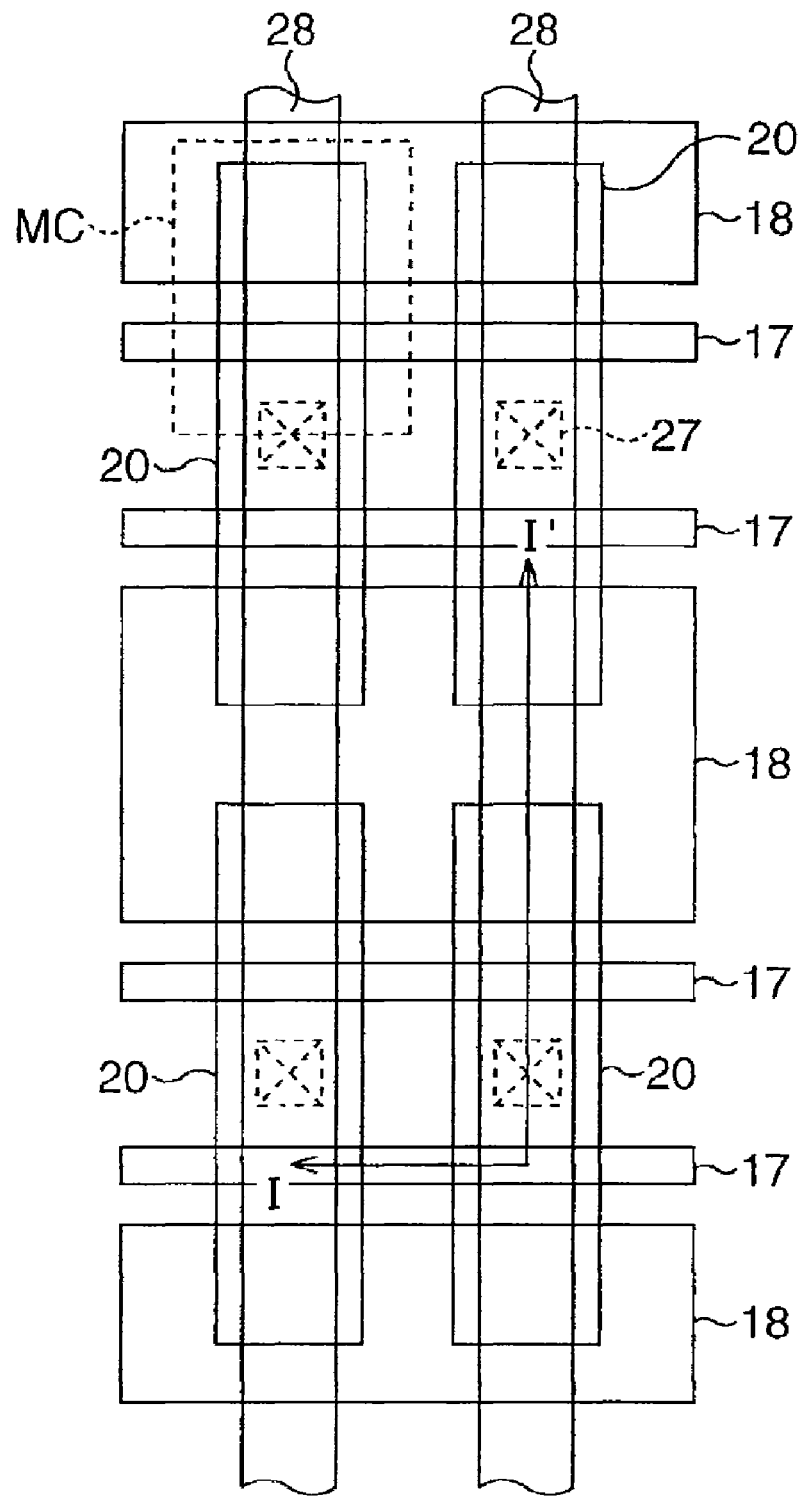
FIG. 11 is a schematic plan view showing an appearance of the semiconductor memory manufactured according to the present embodiment.

Subsequently, an interlayer insulating film 26 and a contact hole 27 are formed as shown in FIG. 10A.

In detail, an insulating film, here, a silicon oxide film is deposited so as to cover a whole surface of the silicon semiconductor substrate 1 by the CVD method and so on, to form the interlayer insulating film 26.

Next, the interlayer insulating film 26 is processed by the lithography and the dry etching so as to expose a part of the surface of the drain region 25, to form the contact hole 27.

After that, a resist mask (not shown) used for the dry etching is removed by the asking treatment and so on.

Figure 10B:
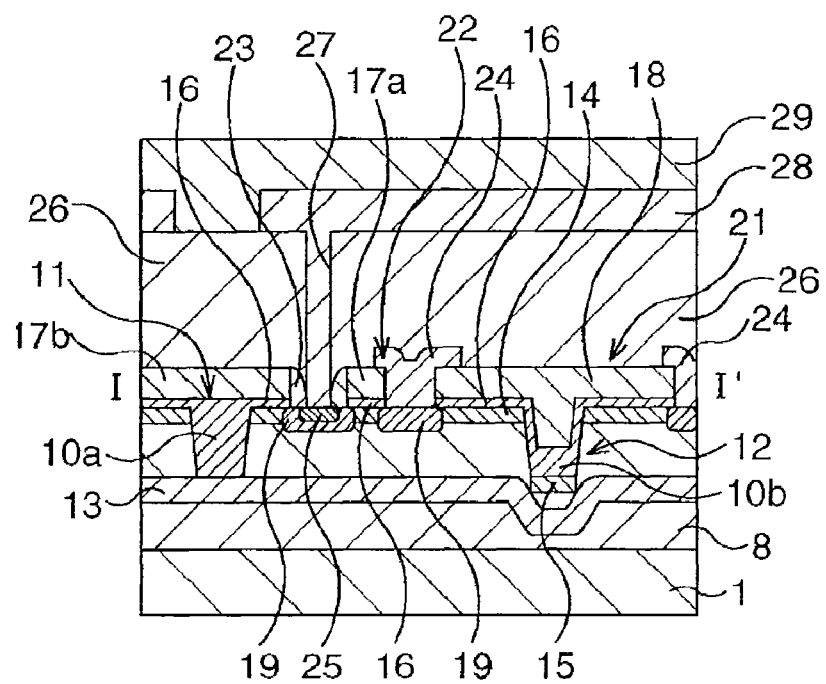

Subsequently, various wirings, a protective film 29, and so on are formed as shown in FIG. 10B and FIG. 11.

Metallic material (not shown) such as Al alloy is deposited on the interlayer insulating film 26 and the contact hole 27, by a spattering method and so on. This metallic material is processed by the lithography and the dry etching to form the various wirings. A state in which a bit line 28 constituted by electrically connected with the drain region 25 is formed, is shown in FIG. 10B.

Next, the protective film 29 such as a silicon oxide film is formed so as to cover the bit line 28 and so on by the CVD method and so on.

After that, further interlayer insulating films, upper wirings, upper protective films, and so on are formed to thereby complete the semiconductor memory of the present embodiment.

As described above, according to the present embodiment, the channel stop regions 13, 15 are formed at desired portions under the respective STI structures 11, 12 having different thicknesses of the insulators 10, without incurring an increase of process steps and a complication of a manufacturing process, and a further improvement in a degree of integration in a semiconductor memory can be realized easily and certainly.

According to the present invention, it becomes possible to form a channel stop region at a desired portion under respective STI structures having insulators with different thicknesses, and to realize further improvement in a degree of integration in a semiconductor memory easily and certainly without incurring an increase of process steps and a complication of a manufacturing process.

The present embodiment is to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A manufacturing method of a semiconductor device, comprising the steps of:
    forming trenches at plural element isolation regions of a semiconductor substrate respectively, and filling inside of the respective trenches with insulators;
    defining active regions on the semiconductor substrate by forming a first element isolation structure in a first trench and a second element isolation structure in a second trench respectively by removing a part of the insulator only from inside of the second trench;
    simultaneously forming a first impurity region at least at a lower portion of the first element isolation structure and a second impurity region at a first portion aligned to and under the second element isolation structure and deeper than the first impurity region by doping a first impurity into a portion including the first element isolation structure and the second element isolation structure of the semiconductor substrate; and
    simultaneously forming a third impurity region at a surface layer portion of the active region and a fourth impurity region at a matched portion under the second element isolation structure and between the second element isolation structure and the second impurity region by doping a second impurity into a portion including the first element isolation structure and the second element isolation structure of the semiconductor substrate.

2. The manufacturing method of the semiconductor device according to claim 1,
    wherein a doping condition of the second impurity is adjusted so that an impurity concentration of the fourth impurity region becomes to be the impurity concentration of the second impurity region or more.

3. The manufacturing method of the semiconductor device according to claim 1,
    wherein the first impurity and the second impurity are same conductivity type.

4. The manufacturing method of the semiconductor device according to claim 2,
    wherein the impurity concentration of the fourth impurity region is $1 \times 10^{17}/cm^3$ or more.

5. The manufacturing method of the semiconductor device according to claim 2,
    wherein the first impurity region and the second impurity region are integrally formed in a shape extending from the first element isolation structure to the second element isolation structure, and the second impurity region being formed at the second portion under the second element isolation structure spaced with depth from the surface layer.

6. The manufacturing method of the semiconductor device according to claim 2,
    wherein a transistor structure is formed at the active region, and a pair of capacitor structures are formed so as to straddle between a pair of the adjacent active regions adjacent via the second element isolation structure and constituted by electrically isolated from one another by the insulator of the second element isolation structure.

7. The manufacturing method of the semiconductor device according to claim 6, further comprising the steps of:
    forming an insulating film from the active region to a sidewall of the trench of the second element isolation structure after the third impurity region and the fourth impurity region are formed;
    forming a conductive film on the insulating film; and
    simultaneously forming a gate electrode of the transistor structure interposing the insulating film functioning as a gate insulating film on the active region, and an upper electrode of the capacitor structure interposing the insulating film functioning as a dielectric film on the pair of the adjacent active regions adjacent via the second element isolation structure, by processing the conductive film.

8. The manufacturing method of the semiconductor device according to claim 7,
    wherein a pair of fifth impurity regions are formed by doping a third impurity into a surface layer of the active regions at both sides of the gate electrode by using the gate electrode and the upper electrode as masks, and the third impurity is doped into inside of the gate electrode and inside of the upper electrode.

* * * * *